US012787462B2

(12) United States Patent
Chien et al.

(10) Patent No.: US 12,787,462 B2
(45) Date of Patent: Nov. 3, 2026

(54) CHIP PACKAGE AND MANUFACTURING METHOD THEREOF

(71) Applicant: Xintec Inc., Taoyuan City (TW)

(72) Inventors: Wei-Ming Chien, Taoyuan City (TW); Po-Han Lee, Taipei City (TW); Tsang Yu Liu, Zhubei City (TW); Joey Lai, Hsinchu City (TW)

(73) Assignee: Xintec Inc., Taoyuan City (TW)

( * ) Notice: Subject to any disclaimer, the term of this patent is extended or adjusted under 35 U.S.C. 154(b) by 659 days.

(21) Appl. No.: 18/304,325

(22) Filed: Apr. 20, 2023

(65) Prior Publication Data

US 2023/0361144 A1 Nov. 9, 2023

Related U.S. Application Data

(60) Provisional application No. 63/337,925, filed on May 3, 2022.

(51) Int. Cl.
*H10F 39/00* (2025.01)

(52) U.S. Cl.
CPC ....... *H10F 39/026* (2025.01); *H10F 39/8053* (2025.01); *H10F 39/8057* (2025.01)

(58) Field of Classification Search
CPC ............................. H10F 39/026; H10F 39/199
See application file for complete search history.

(56) References Cited

U.S. PATENT DOCUMENTS 9,799,778 B2 * 10/2017 Kuo ........................ H10F 71/00
9,972,584 B2 * 5/2018 Shen ..................... H10F 77/334
9,978,788 B2 * 5/2018 Ho ........................ H10F 39/811
10,096,635 B2 * 10/2018 Chien ................. H10F 39/8057
10,424,540 B2 * 9/2019 Ho .......................... H01L 24/16
10,714,528 B2 * 7/2020 Kuan ...................... H01L 24/13
11,450,697 B2 * 9/2022 Chen ..................... H10F 39/028
11,784,134 B2 * 10/2023 Cheng ..................... H01L 24/19 257/678
11,973,095 B2 * 4/2024 Chen ..................... H10F 39/804
12,341,109 B2 * 6/2025 Cheng .................. H01L 21/561
2013/0127022 A1 * 5/2013 Chien ....................... B05D 1/36 257/632

(Continued)

FOREIGN PATENT DOCUMENTS

CN 106098639 A * 11/2016 ........... H10H 20/857
TW 201826510 A 7/2018
TW 202013632 A 4/2020

*Primary Examiner* — Jeff W Natalini
*Assistant Examiner* — Alexander Belousov
(74) *Attorney, Agent, or Firm* — LIU & LIU

(57) ABSTRACT

A chip package includes a light transmissive sheet, a chip, a bonding layer, and an insulating layer. The light transmissive sheet has a protruding portion. A first surface of the chip faces toward the light transmissive sheet and has a sensing area. The bonding layer is located between the chip and the light transmissive sheet. The sum of a thickness of the chip and a thickness of the bonding layer is greater than or equal to a thickness of the light transmissive sheet. A protruding portion of the light transmissive sheet protrudes from a sidewall of the chip and a sidewall of the bonding layer. The insulating layer extends from a second surface of the chip to the protruding portion of the light transmissive sheet along the sidewall of the chip and the sidewall of the bonding layer.

20 Claims, 7 Drawing Sheets

(56) References Cited

U.S. PATENT DOCUMENTS

| | | | | |
|---|---|---|---|---|
| 2016/0322312 | A1* | 11/2016 | Shen | H10H 20/857 |
| 2016/0343882 | A1* | 11/2016 | Kuo | H01L 23/3114 |
| 2017/0110495 | A1* | 4/2017 | Wu | H01L 21/563 |
| 2018/0012853 | A1* | 1/2018 | Lin | H01L 23/3142 |
| 2018/0102321 | A1* | 4/2018 | Ho | H01L 23/498 |
| 2019/0140012 | A1* | 5/2019 | Kuan | H01L 24/97 |
| 2020/0098811 | A1* | 3/2020 | Chen | H01L 21/76898 |
| 2021/0210445 | A1* | 7/2021 | Cheng | H01Q 1/2283 |
| 2022/0344396 | A1* | 10/2022 | Chen | H10F 39/811 |
| 2023/0361144 | A1* | 11/2023 | Chien | H10F 39/804 |
| 2023/0420387 | A1* | 12/2023 | Cheng | H01L 24/19 |

* cited by examiner

100b

CHIP PACKAGE AND MANUFACTURING METHOD THEREOF

CROSS-REFERENCE TO RELATED APPLICATIONS

This application claims priority to U.S. Provisional Application Ser. No. 63/337,925, filed May 3, 2022, which is herein incorporated by reference.

BACKGROUND

Field of Invention

The present disclosure relates to a chip package and a manufacturing method of the chip package.

Description of Related Art

Generally, a chip package for image sensing has a chip and a light transmissive sheet on the chip. The light transmissive sheet allows light to pass through to be received by the sensing area of the chip.

In the wafer-level packaging process, a wafer is bonded to the light transmissive sheet first, and then cut into chips at the end of the process. Since the light transmissive sheet needs to provide supporting force, the thickness of the transparent sheet is much greater than the thickness of the wafer (for example, more than three times), which is not conducive to thinner design. In addition, after the bonded wafer and light-transmitting sheet are cut into chip packages, the sidewalls of the chips and the sidewalls of the light transmissive sheets are exposed, which are easily broken and damaged.

SUMMARY

One aspect of the present disclosure provides a chip package.

According to some embodiments of the present disclosure, a chip package includes a light transmissive sheet, a chip, a bonding layer, and an insulating layer. The light transmissive sheet has a protruding portion. The chip has a first surface and a second surface opposite to the first surface, and the first surface faces toward the light transmissive sheet and has a sensing area. The bonding layer is located between the chip and the light transmissive sheet. The sum of a thickness of the chip and a thickness of the bonding layer is greater than or equal to a thickness of the light transmissive sheet. The protruding portion of the light transmissive sheet protrudes from a sidewall of the chip and a sidewall of the bonding layer. The insulating layer extends from the second surface of the chip to the protruding portion of the light transmissive sheet along the sidewall of the chip and the sidewall of the bonding layer.

In some embodiments, the thickness of the light transmissive sheet is less than 120 μm.

In some embodiments, a distance between a surface of the light transmissive sheet facing the bonding layer and a surface of the protruding portion facing the insulating layer is 15% to 30% of the thickness of the light transmissive sheet.

In some embodiments, the chip package further includes a metal shielding layer located on the second surface of the chip.

In some embodiments, the metal shielding layer extends from the second surface of the chip to the protruding portion of the light transmissive sheet along the sidewall of the chip and the sidewall of the bonding layer.

In some embodiments, the chip package further includes a first filter layer located on the first surface of the chip and not overlapping the sensing area.

In some embodiments, the chip package further includes a second filter layer located on the first surface of the chip, overlapping the sensing area, and surrounded by the first filter layer, wherein a thickness of the second filter layer is less than a thickness of the bonding layer, and is greater than a thickness of the first filter layer.

In some embodiments, the chip package further includes an infrared filter layer located between the light transmissive sheet and the bonding layer.

In some embodiments, the chip package further includes an infrared filter layer located between the chip and the bonding layer.

In some embodiments, the chip has a conductive pad and a through hole that exposes the conductive pad, and the chip package further includes an isolation layer and a redistribution layer. The isolation layer is located on the second surface of the chip and a sidewall of the through hole. The redistribution layer is located on the isolation layer and electrically connected to the conductive pad.

In some embodiments, the chip package further includes a conductive structure protruding from the insulating layer and located on the redistribution layer.

Another aspect of the present disclosure provides a manufacturing method of a chip package.

According to some embodiments of the present disclosure, a manufacturing method of a chip package includes bonding a light transmissive sheet to a first surface of a wafer by a bonding layer, wherein the first surface of the wafer has a sensing area; cutting from a second surface of the wafer facing away from the bonding layer to the light transmissive sheet to form a trench, such that the light transmissive sheet has a protruding portion below the trench, and the protruding portion protrudes from a sidewall of the wafer and a sidewall of the bonding layer; forming an insulating layer extending from the second surface of the wafer to the protruding portion of the light transmissive sheet along the sidewall of the wafer and the sidewall of the bonding layer; grinding the light transmissive sheet such that a sum of a thickness of the wafer and a thickness of the bonding layer is greater than or equal to a thickness of the light transmissive sheet; and cutting the insulating layer and the light transmissive sheet along the trench.

In some embodiments, grinding the light transmissive sheet is performed such that a distance between a surface of the light transmissive sheet facing the bonding layer and a surface of the protruding portion facing the insulating layer is 15% to 30% of the thickness of the light transmissive sheet.

In some embodiments, the manufacturing method of the chip package further includes forming a metal shielding layer on the second surface of the wafer.

In some embodiments, the manufacturing method of the chip package further includes forming a first filter layer on the first surface of the wafer, wherein the first filter layer does not overlap the sensing area.

In some embodiments, the manufacturing method of the chip package further includes forming a second filter layer on the first surface of the wafer and overlapping the sensing area, wherein the second filter layer is surrounded by the first filter layer, and a thickness of the second filter layer is less than a thickness of the bonding layer, and is greater than a thickness of the first filter layer.

In some embodiments, the manufacturing method of the chip package further includes forming an infrared filter layer on the light transmissive sheet.

In some embodiments, the manufacturing method of the chip package further includes forming an infrared filter layer on the first surface of the wafer.

In some embodiments, the first surface of the wafer has a conductive pad, and the method further includes forming a through hole in the wafer, wherein the conductive pad is exposed through the through hole; and forming an isolation layer on the second surface of the wafer and a sidewall of the through hole.

In some embodiments, the manufacturing method of the chip package further includes forming a redistribution layer on the isolation layer, wherein the redistribution layer extends into the through hole and is electrically connected to the conductive pad.

In some embodiments, the manufacturing method of the chip package further includes forming a conductive structure on the redistribution layer such that the conductive structure protrudes from the insulating layer.

In the aforementioned embodiments of the present disclosure, since the protruding portion of the light transmissive sheet of the chip package protrudes from the sidewall of the chip and the sidewall of the bonding layer, the insulating layer can cover the sidewall of the chip and extends into the light transmissive sheet. As a result, the insulating layer can protect the sidewall of the chip from cracking and damage, and can also improve the strength of the entire chip package. Accordingly, grinding the light transmissive sheet can be performed to facilitate thinner design.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
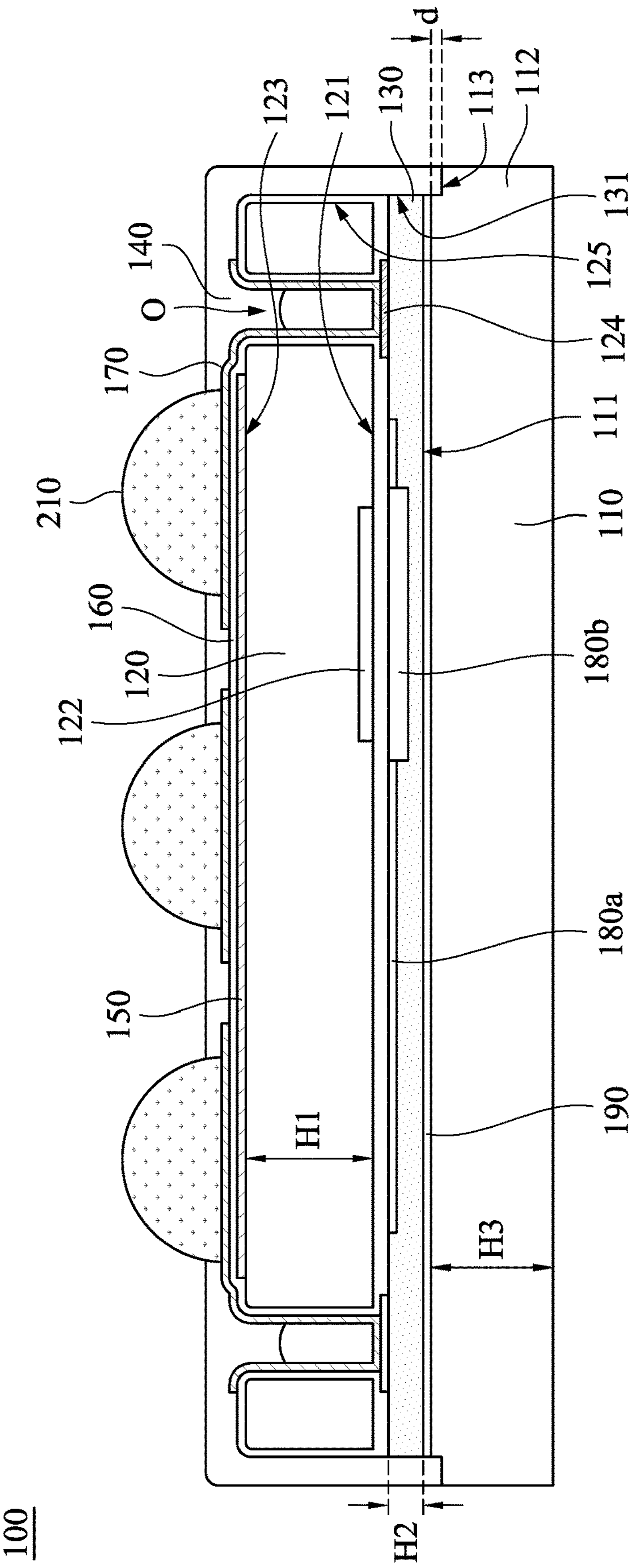
FIG. 1 is a cross-sectional view of a chip package according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view of a chip package 100 according to one embodiment of the present disclosure. The chip package 100 includes a light transmissive sheet 110, a chip 120, a bonding layer 130, and an insulating layer 140. The light transmissive sheet 110 has a protruding portion 112 that protrudes along a horizontal direction, such that the light transmissive sheet 110 has a recess above the protruding portion 112. The chip 120 has a first surface 121 and a second surface 123 opposite to the first surface 121, and the first surface 121 faces toward the light transmissive sheet 110 and has a sensing area 122. The sensing area 122 may be an image sensing area. The bonding layer 130 is located between the chip 120 and the light transmissive sheet 110, and is configured to connect the chip 120 and the light transmissive sheet 110. The sum of a thickness H1 of the chip 120 and a thickness H2 of the bonding layer 130 is greater than or equal to the thickness H3 of the light transmissive sheet 110. In other words, $(H1+H2)/H3 \geq 1$. Moreover, the protruding portion 112 of the light transmissive sheet 110 protrudes from a sidewall 125 of the chip 120 and a sidewall 131 of the bonding layer 130, and thus there is a space above the protruding portion 112 for accommodating the insulating layer 140. The insulating layer 140 extends from the second surface 123 of the chip 120 to the protruding portion 112 of the light transmissive sheet 110 along the sidewall 125 of the chip 120 and the sidewall 131 of the bonding layer 130.

In this embodiment, the material of the light transmissive sheet 110 may be glass, and the bonding layer 130 may be optical clear adhesive. The light transmissive sheet 110 and the bonding layer 130 can allow light to pass through to be detected by the sensing area 122 of the chip 120.

Specifically, since the protruding portion 112 of the light transmissive sheet 110 of the chip package 100 protrudes from the sidewall 125 of the chip 120 and the sidewall 131 of the bonding layer 130, the insulating layer 140 can cover the sidewall 125 of the chip 120 and extends into the light transmissive sheet 110. As a result, the insulating layer 140 can protect the sidewall 125 of the chip 120 from cracking and damage, and can also improve the strength of the entire chip package 100. Accordingly, grinding the light transmissive sheet 110 can be performed to facilitate thinner design.

In this embodiment, the thickness H3 of the light transmissive sheet 110 may be less than 120 μm through grinding the light transmissive sheet 110. A distance d between a surface 111 of the light transmissive sheet 110 facing the bonding layer 130 and a surface 113 of the protruding portion 112 facing the insulating layer 140 is 15% to 30% of the thickness H3 of the light transmissive sheet 110, thereby ensuring the insulating layer 140 to cover the sidewall 125 of the chip 120 and enter the light transmissive sheet 110.

The chip package 110 may further include a metal shielding layer 150 located on the second surface 123 of the chip 120. The material of the metal shielding layer 150 may be aluminum for shielding electromagnetic interference. In addition, in this embodiment, the chip package further includes a first filter layer 180*a* and a second filter layer 180*b*. The first filter layer 180*a* is located on the first surface 121 of the chip 120 and does not overlap the sensing area 122. The second filter layer 180*b* is located on the first surface 121 of the chip 120 and overlaps the sensing area 122. The second filter layer 180*b* is surrounded by the first filter layer 180*a*. The thickness of the second filter layer 180*b* is less than the thickness of the bonding layer 130, and is greater than the thickness of the first filter layer 180*a*. Such a configuration can form a stepped structure to prevent the bonding layer 130 from forming bubble caused by excessive step difference.

Furthermore, the chip package 100 may further include an infrared (IR) filter layer 190. In this embodiment, the infrared filter layer 190 is located between the light transmissive sheet 110 and the bonding layer 130, and may be in contact with the surface 111 of the light transmissive sheet 110. The infrared filter layer 190 can prevent noise light transmitting to the sensing area 122 of the chip 120.

In some embodiments, the chip 120 has a conductive pad 124 and a through hole O that exposes the conductive pad 124. The chip package 100 further includes an isolation layer 160, a redistribution layer 170, and a conductive structure 210. The isolation layer 160 is located on the second surface 123 of the chip 120 and the sidewall of the through hole O. The redistribution layer 170 is located on the isolation layer 160 and extends into the through hole O. The redistribution layer 170 is electrically connected to the conductive pad 124 of the chip 120. The conductive structure 210 protrudes from the insulating layer 140 and is located on the redistribution layer 170. The conductive structure 210 may be used to electrically connect an external electronic device (e.g., a printed circuit board).

It is to be noted that the connection relationships, the materials, and the advantages of the elements described above will not be repeated in the following description. In the following description, the manufacturing method of the chip package will be explained. The manufacturing method of the chip package may be wafer-level packaging to improve product yield and productivity.

Figure 2:
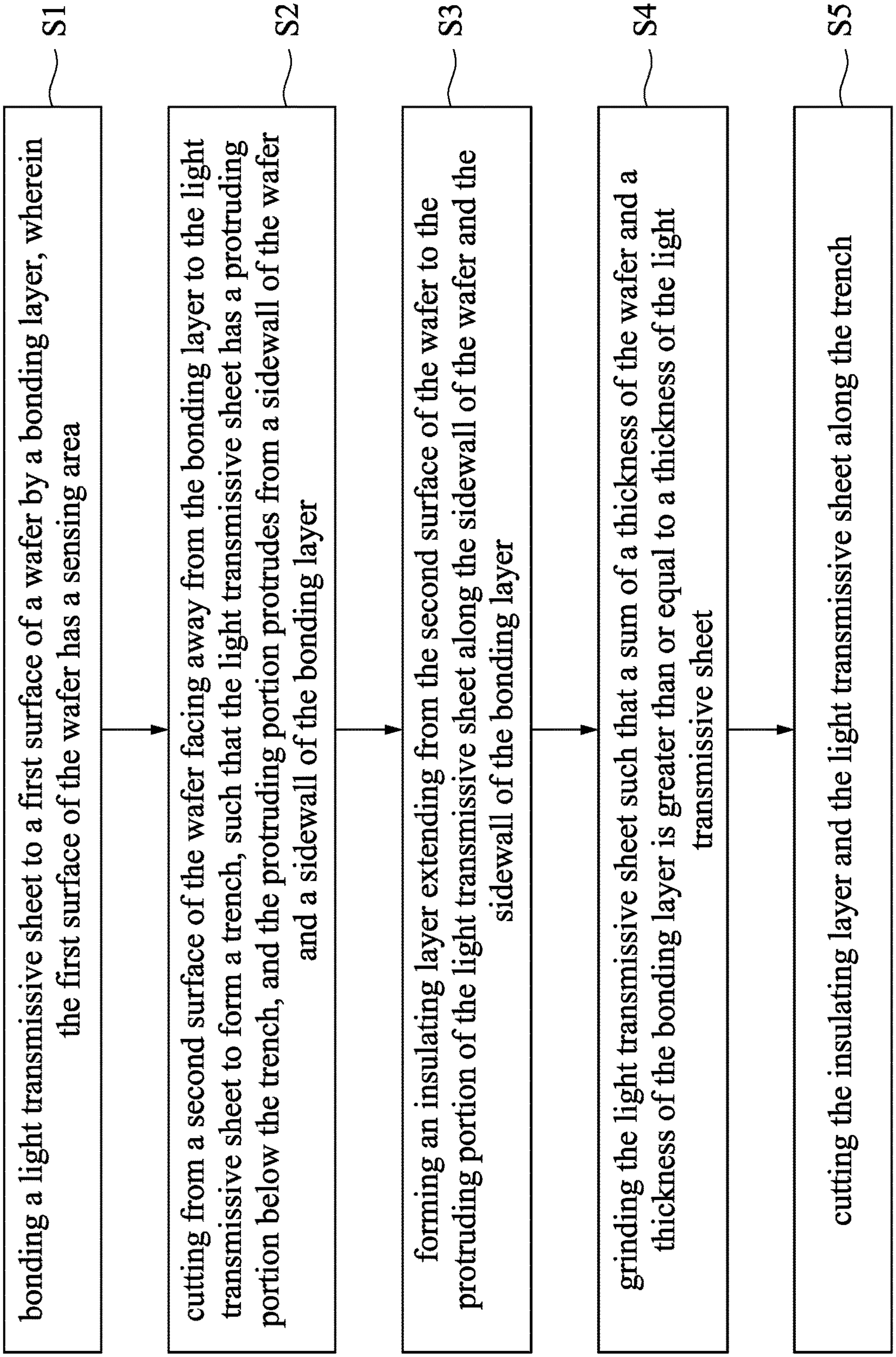
FIG. 2 is a flow chart of a manufacturing method of a chip package according to one embodiment of the present disclosure.

FIG. 2 is a flow chart of a manufacturing method of a chip package according to one embodiment of the present disclosure. The manufacturing method of the chip package includes the following steps. In step 1, a light transmissive sheet is bonded to a first surface of a wafer by a bonding layer, wherein the first surface of the wafer has a sensing area. Thereafter, in step S2, cutting from a second surface of the wafer facing away from the bonding layer to the light transmissive sheet is performed to form a trench, such that the light transmissive sheet has a protruding portion below the trench, and the protruding portion protrudes from a sidewall of the wafer and a sidewall of the bonding layer. Afterwards, in step S3, an insulating layer extending from the second surface of the wafer to the protruding portion of the light transmissive sheet along the sidewall of the wafer and the sidewall of the bonding layer is formed. Next, in step S4, grinding the light transmissive sheet is performed such that a sum of a thickness of the wafer and a thickness of the bonding layer is greater than or equal to a thickness of the light transmissive sheet. Subsequently, in step S5, the insulating layer and the light transmissive sheet are cut along the trench. The manufacturing method of the chip package is not limited to the above steps S1 to S5. For example, in some embodiments, the manufacturing method can further include other steps between two of the above steps, or can further include other steps before step S1 and after step S5.

In the following description, the aforementioned steps of the manufacturing method of the chip package will be explained in detail.

Figure 3:
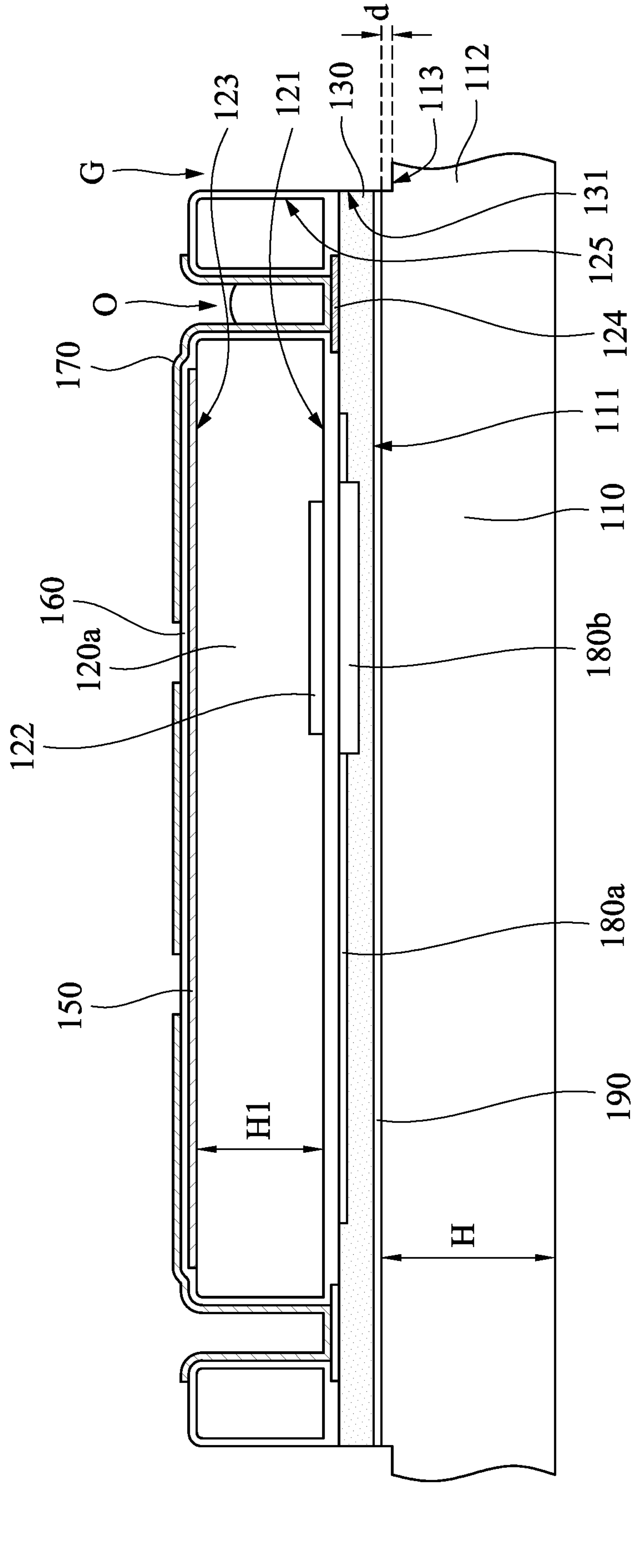
FIGS. 3 to 5 are cross-sectional views at various stages of the manufacturing method of the chip package of FIG. 1.
Figure 4:
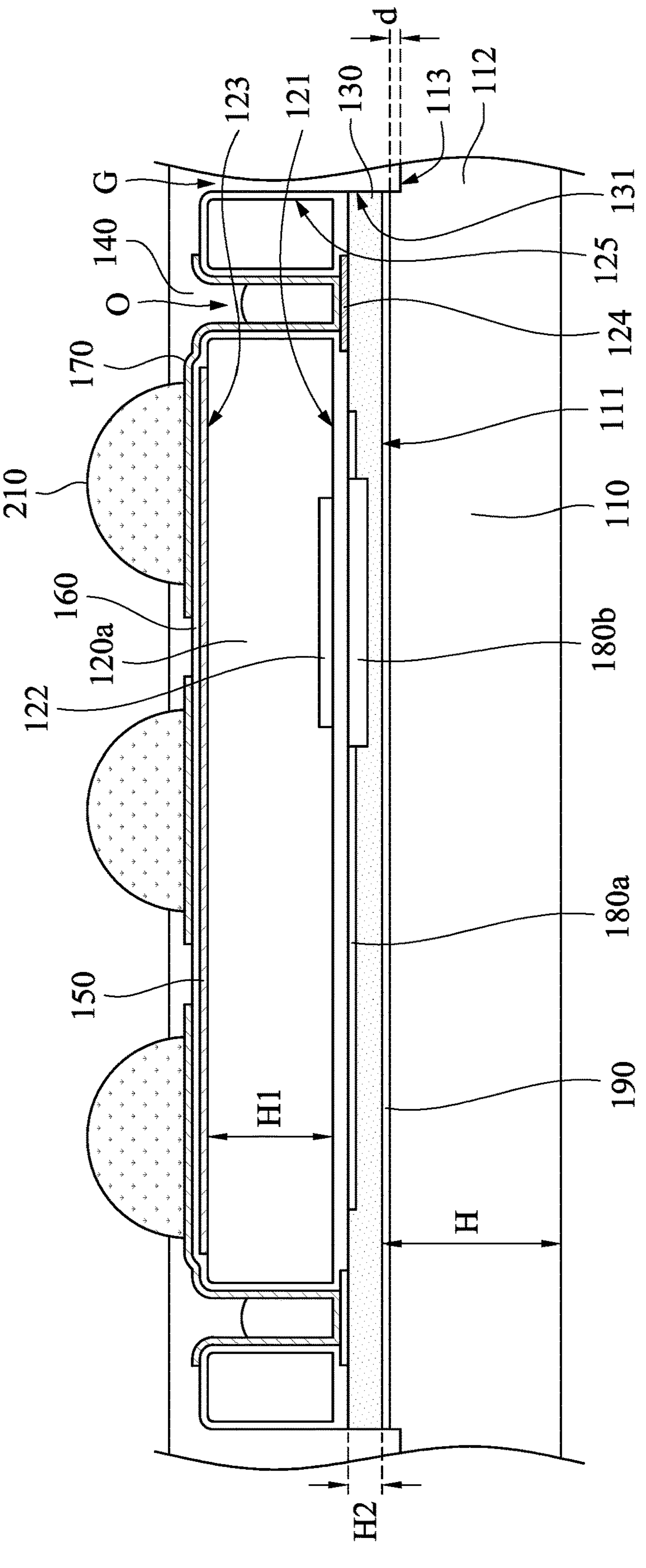
Figure 5:
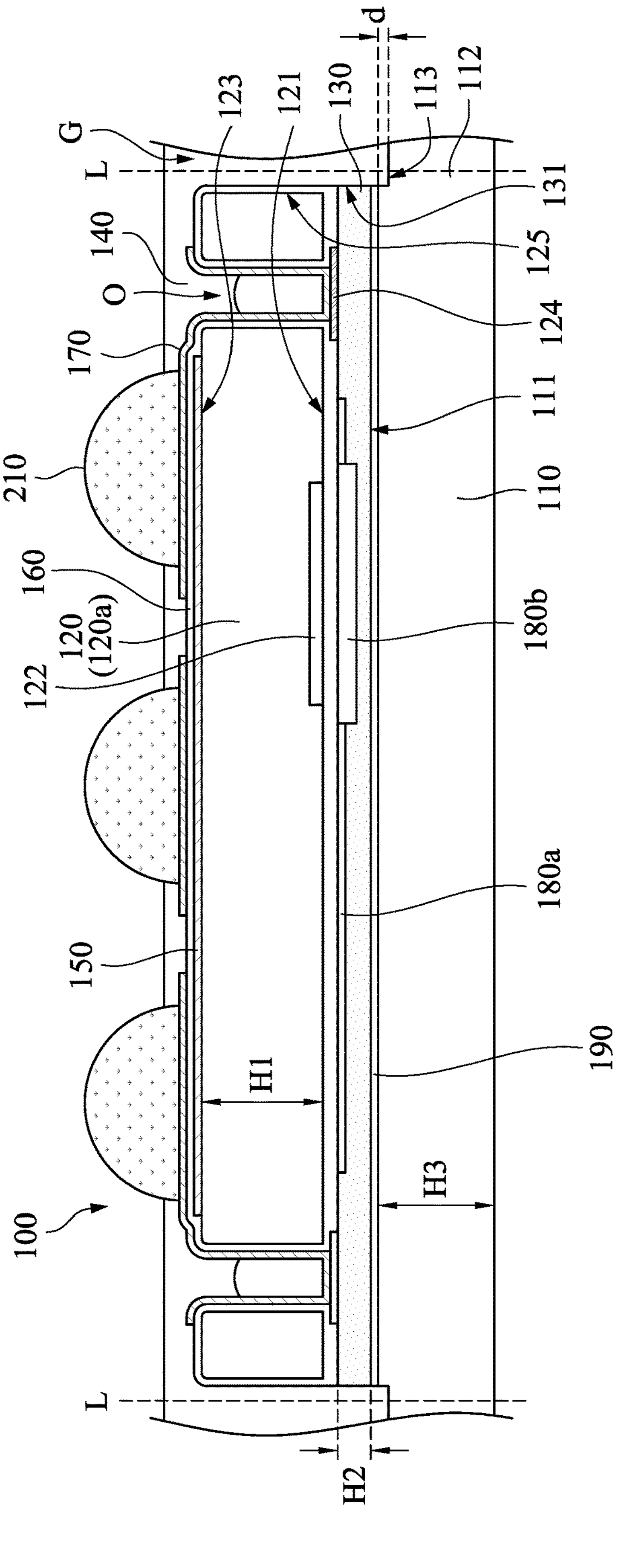

FIGS. 3 to 5 are cross-sectional views at various stages of the manufacturing method of the chip package 100 of FIG. 1. As shown in FIG. 3, the light transmissive sheet 110 is bonded to the first surface 121 of a wafer 120*a* by the bonding layer 130, wherein the first surface 121 of the wafer 120*a* has the sensing area 122. The wafer 120*a* is a semiconductor structure which is not yet cut to form the chip 120 of FIG. 1. Before the light transmissive sheet 110 is bonded to the wafer 120*a*, the first filter layer 180*a* can be formed on the first surface 121 of the wafer 120*a*, wherein the first filter layer 180*a* does not overlap the sensing area 122. After the formation of the first filter layer 180*a*, the second filter layer 180*b* can be formed on the first surface 121 of the wafer 120*a*, and overlaps the sensing area 122, wherein the second filter layer 180*b* is surrounded by the first filter layer 180*a*. The thickness of the second filter layer 180*b* is less than the thickness of the bonding layer 130, and is greater than the thickness of the first filter layer 180*a*. In some embodiments, before the light transmissive sheet 110 is bonded to the wafer 120*a*, the infrared filter layer 190 may be formed on the first surface 111 of the wafer 110.

After bonding the wafer 120*a* and the light transmissive sheet 110, the second surface 123 of the wafer 120*a* can be thinned by grinding. Thereafter, the metal shielding layer 150 may be formed on the second surface 123 of the wafer 120*a*. In FIG. 3, grinding the light transmissive sheet 110 is not yet performed, and a thickness H of the light transmissive sheet 110 may be greater than the sum of the thickness H1 of the wafer 120*a* and the thickness H2 of the bonding layer 130.

After the formation of the metal shielding layer 150, the through hole O can be formed in the wafer 120*a*, wherein the conductive pad 124 is exposed through the through hole O. Afterwards, the isolation layer 160 can be formed on the second surface 123 of the wafer 120*a* and the sidewall of the through hole O. The isolation layer 160 is patterned to expose the conductive pad 124. Thereafter, the redistribution layer 170 can be formed on the isolation layer 160, wherein the redistribution layer 170 extends into the through hole O and is electrically connected to the conductive pad 1124.

After the formation of the redistribution layer 170, cutting from the second surface 123 of the wafer 120*a* facing away from the bonding layer 130 to the light transmissive sheet 110 can be performed, thereby forming a trench G, such that the light transmissive sheet 110 has the protruding portion 112 below the trench G, and the protruding portion 112 protrudes from the sidewall 125 of the wafer 120*a* and the sidewall 131 of the bonding layer 130.

As shown in FIG. 4, after the formation of the trench G, the insulating layer 140 extending from the second surface 123 of the wafer 120*a* to the protruding portion 112 of the light transmissive sheet 110 along the sidewall 125 of the wafer 120*a* and the sidewall 131 of the bonding layer 130 can be formed. Thereafter, the insulating layer 140 may be patterned to expose the redistribution layer 170 on the second surface 123. Afterwards, the conductive structure 210 can be formed on the exposed redistribution layer 170 such that the conductive structure 210 protrudes from the insulating layer 140.

As shown in FIG. 5, after the formation of the conductive structure 210, grinding the light transmissive sheet 110 is performed to reduce the thickness H of the light transmissive sheet 110 to the thickness H3, such that the sum of the thickness H1 of the wafer 120*a* and the thickness H2 of the bonding layer 130 is greater than or equal to the thickness H3 of the light transmissive sheet 110, and the distance d between the surface 111 of the light transmissive sheet 110 facing the bonding layer 130 and the surface 113 of the protruding portion 112 facing the insulating layer 140 is 15% to 30% of the thickness H3 of the light transmissive sheet 110. Subsequently, the insulating layer 140 and the light transmissive sheet 110 may be cut along the trench G (e.g., a line L). Through the aforementioned steps, the chip package 100 of FIG. 1 can be obtained.

Figure 6:
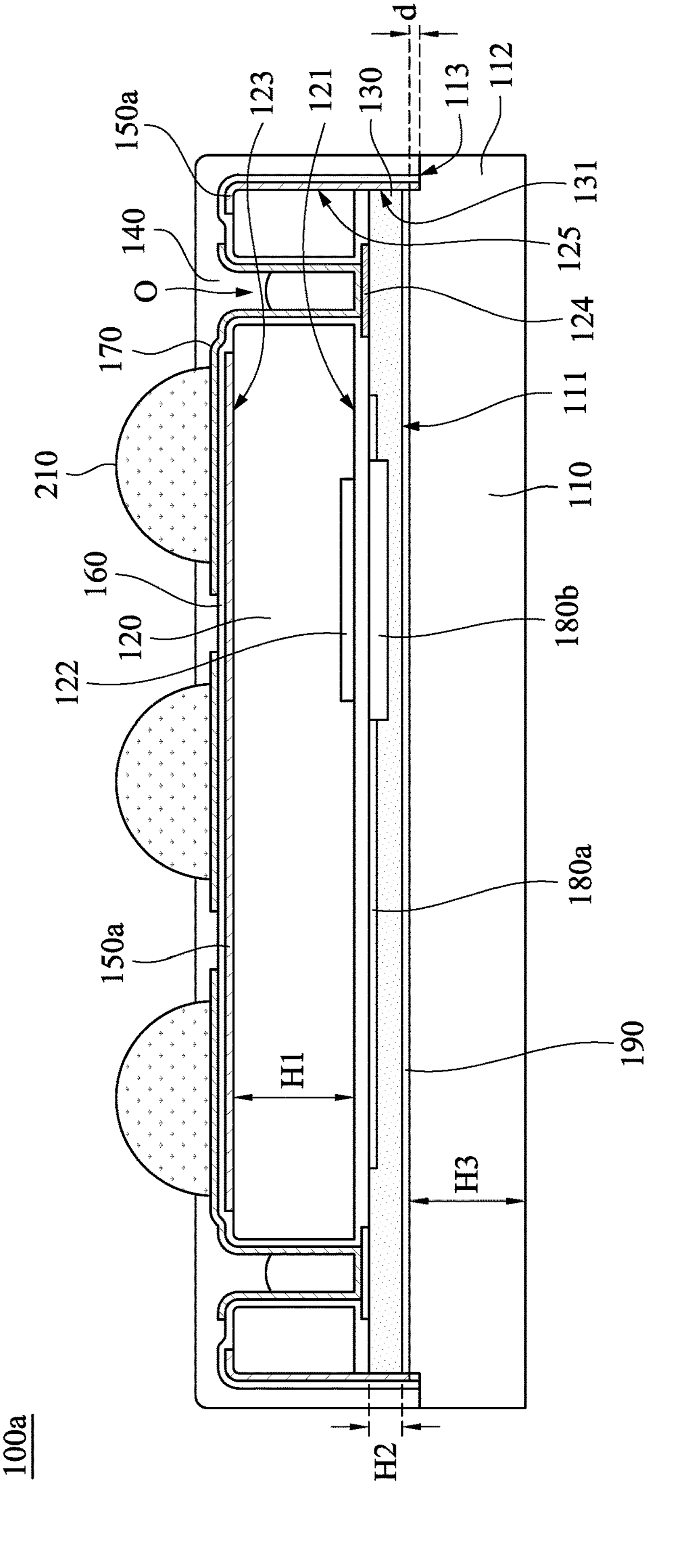
FIG. 6 is a cross-sectional view of a chip package according to another embodiment of the present disclosure.

FIG. 6 is a cross-sectional view of a chip package 100*a* according to another embodiment of the present disclosure. The chip package 100*a* includes the light transmissive sheet 110, the chip 120, the bonding layer 130, the insulating layer 140, and a metal shielding layer 150*a*. The difference between this embodiment and the embodiment of FIG. 1 is that the metal shielding layer 150*a* of the chip package 100*a* further extends from the second surface 123 of the chip 120 to the protruding portion 112 of the light transmissive sheet 110 along the sidewall 125 of the chip 120 and the sidewall 131 of the bonding layer 130. Such a configuration can improve the capacity for shielding electromagnetic interference.

Figure 7:
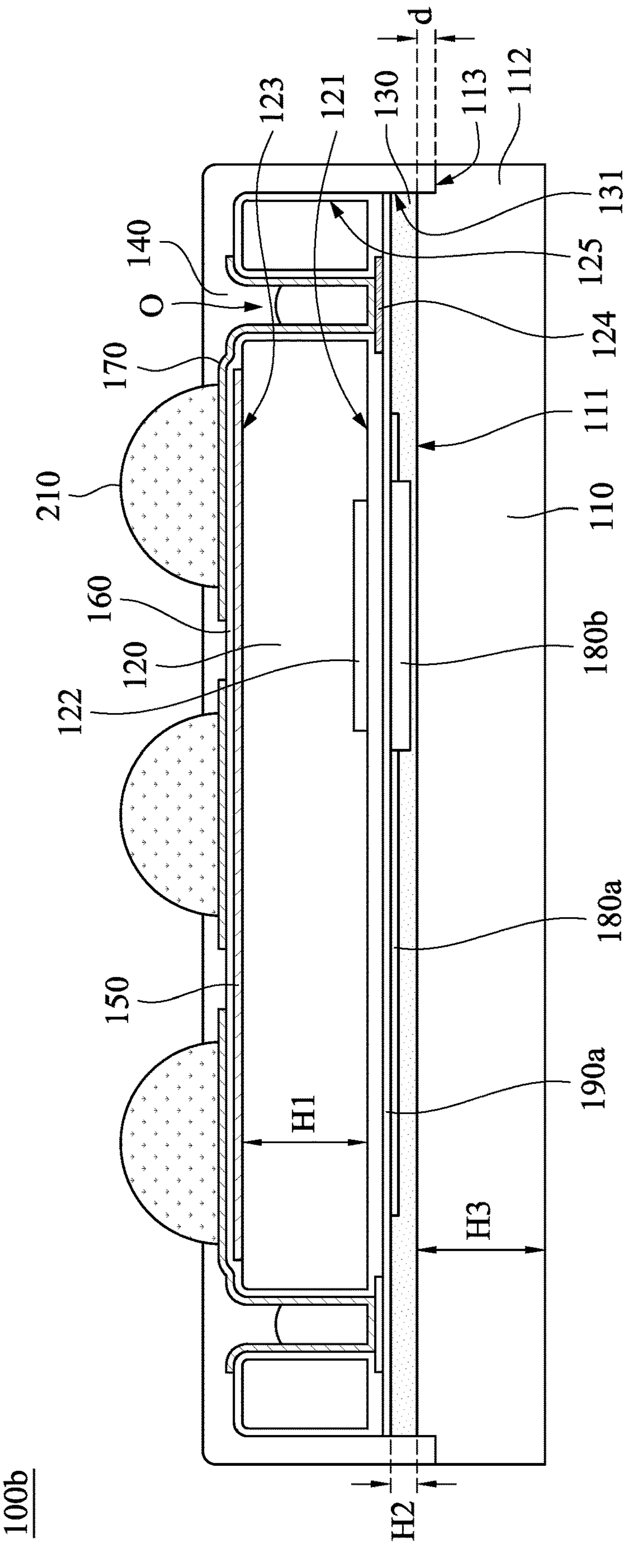
FIG. 7 is a cross-sectional view of a chip package according to still another embodiment of the present disclosure.

FIG. 7 is a cross-sectional view of a chip package 100*b* according to still another embodiment of the present disclosure. The chip package 100*b* includes the light transmissive sheet 110, the chip 120, the bonding layer 130, the insulating layer 140, and an infrared filter layer 190*a*. The difference between this embodiment and the embodiment of FIG. 1 is that the infrared filter layer 190*a* of the chip package 100*b* is located between the chip 120 and the bonding layer 130. For example, the infrared filter layer 190*a* is formed on the first surface 121 of the wafer 120*a* (see FIG. 3).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package, comprising:
- a light transmissive sheet having a protruding portion;
- a chip having a first surface and a second surface opposite to the first surface, wherein the first surface faces toward the light transmissive sheet and has a sensing area;
- a bonding layer located between the chip and the light transmissive sheet, wherein a sum of a thickness of the chip and a thickness of the bonding layer is greater than or equal to a thickness of the light transmissive sheet, and the protruding portion of the light transmissive sheet protrudes from a sidewall of the chip and a sidewall of the bonding layer; and
- an insulating layer extending from the second surface of the chip to the protruding portion of the light transmissive sheet along the sidewall of the chip and the sidewall of the bonding layer, wherein the insulating layer is in direct contact with the protruding portion of the light transmissive sheet, and the bonding layer extends from a first inner sidewall of the insulating layer to a second inner sidewall of the insulating layer opposite to the first inner sidewall such that the entire sensing area of the chip is covered by the bonding layer.

2. The chip package of claim 1, wherein the thickness of the light transmissive sheet is less than 120 μm.

3. The chip package of claim 1, wherein a distance between a surface of the light transmissive sheet facing the bonding layer and a surface of the protruding portion facing the insulating layer is 15% to 30% of the thickness of the light transmissive sheet.

4. The chip package of claim 1, further comprising:
- a metal shielding layer located on the second surface of the chip.

5. The chip package of claim 4, wherein the metal shielding layer extends from the second surface of the chip to the protruding portion of the light transmissive sheet along the sidewall of the chip and the sidewall of the bonding layer.

6. The chip package of claim 1, further comprising:
- a first filter layer located on the first surface of the chip and not overlapping the sensing area.

7. The chip package of claim 6, further comprising:
- a second filter layer located on the first surface of the chip, overlapping the sensing area, and surrounded by the first filter layer, wherein a thickness of the second filter layer is less than a thickness of the bonding layer, and is greater than a thickness of the first filter layer.

8. The chip package of claim 1, further comprising:
- an infrared filter layer located between the light transmissive sheet and the bonding layer.

9. The chip package of claim 1, further comprising:
- an infrared filter layer located between the chip and the bonding layer.

10. The chip package of claim 1, wherein the chip has a conductive pad and a through hole that exposes the conductive pad, and the chip package further comprises:
- an isolation layer located on the second surface of the chip and a sidewall of the through hole; and
- a redistribution layer located on the isolation layer and electrically connected to the conductive pad.

11. The chip package of claim 10, further comprising:
- a conductive structure protruding from the insulating layer and located on the redistribution layer.

12. A manufacturing method of a chip package, comprising:
- bonding a light transmissive sheet to a first surface of a wafer by a bonding layer, wherein the first surface of the wafer has a sensing area;
- cutting from a second surface of the wafer facing away from the bonding layer to the light transmissive sheet to form a trench, such that the light transmissive sheet has a protruding portion below the trench, and the protruding portion protrudes from a sidewall of the wafer and a sidewall of the bonding layer;
- forming an insulating layer extending from the second surface of the wafer to the protruding portion of the light transmissive sheet along the sidewall of the wafer and the sidewall of the bonding layer, wherein the insulating layer is in direct contact with the protruding portion of the light transmissive sheet, and the bonding layer extends from a first inner sidewall of the insulating layer to a second inner sidewall of the insulating layer opposite to the first inner sidewall such that the entire sensing area is covered by the bonding layer;

grinding the light transmissive sheet such that a sum of a thickness of the wafer and a thickness of the bonding layer is greater than or equal to a thickness of the light transmissive sheet; and cutting the insulating layer and the light transmissive sheet along the trench.

13. The manufacturing method of the chip package of claim 12, wherein grinding the light transmissive sheet is performed such that a distance between a surface of the light transmissive sheet facing the bonding layer and a surface of the protruding portion facing the insulating layer is 15% to 30% of the thickness of the light transmissive sheet.

14. The manufacturing method of the chip package of claim 12, further comprising:

forming a metal shielding layer on the second surface of the wafer.

15. The manufacturing method of the chip package of claim 12, further comprising:

forming a first filter layer on the first surface of the wafer, wherein the first filter layer does not overlap the sensing area.

16. The manufacturing method of the chip package of claim 15, further comprising:

forming a second filter layer on the first surface of the wafer and overlapping the sensing area, wherein the second filter layer is surrounded by the first filter layer, and a thickness of the second filter layer is less than a thickness of the bonding layer, and is greater than a thickness of the first filter layer.

17. The manufacturing method of the chip package of claim 12, further comprising:

forming an infrared filter layer on the light transmissive sheet or the first surface of the wafer.

18. The manufacturing method of the chip package of claim 12, wherein the first surface of the wafer has a conductive pad, and the method further comprises:

forming a through hole in the wafer, wherein the conductive pad is exposed through the through hole; and forming an isolation layer on the second surface of the wafer and a sidewall of the through hole.

19. The manufacturing method of the chip package of claim 18, further comprising:

forming a redistribution layer on the isolation layer, wherein the redistribution layer extends into the through hole and is electrically connected to the conductive pad.

20. The manufacturing method of the chip package of claim 19, further comprising:

forming a conductive structure on the redistribution layer such that the conductive structure protrudes from the insulating layer.

* * * * *